(12) United States Patent
Thees et al.

(10) Patent No.: US 8,722,479 B2
(45) Date of Patent: May 13, 2014

(54) METHOD OF PROTECTING STI STRUCTURES FROM EROSION DURING PROCESSING OPERATIONS

(75) Inventors: Hans-Juergen Thees, Dresden (DE); Stephan Kronholz, Dresden (DE); Joerg Radecker, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 357 days.

(21) Appl. No.: 13/115,270

(22) Filed: May 25, 2011

(65) Prior Publication Data

US 2012/0302037 A1  Nov. 29, 2012

(51) Int. Cl.
*H01L 21/76* (2006.01)

(52) U.S. Cl.
USPC ............ 438/197; 257/E21.546; 438/430; 438/478; 438/697

(58) Field of Classification Search
USPC ......... 438/400, 401, 285, 197, 300, 430, 270, 438/429, 697
See application file for complete search history.

(56) References Cited

U.S. PATENT DOCUMENTS

| | | | |
|---|---|---|---|
| 6,080,628 A | 6/2000 | Cherng | |
| 6,518,148 B1 | 2/2003 | Cheng et al. | |
| 6,566,228 B1 | 5/2003 | Beintner et al. | |
| 7,291,541 B1 | 11/2007 | Foote | |
| 7,491,964 B2 | 2/2009 | Buehrer et al. | |
| 7,906,407 B2 | 3/2011 | Rossi et al. | |
| 7,915,137 B2 | 3/2011 | Williams | |
| 7,955,947 B2 | 6/2011 | Williams | |
| 8,288,801 B2 * | 10/2012 | Yang | 257/263 |
| 2005/0095794 A1 * | 5/2005 | Park | 438/296 |
| 2009/0298273 A1 * | 12/2009 | Lee et al. | 438/589 |

* cited by examiner

*Primary Examiner* — Savitr Mulpuri
(74) *Attorney, Agent, or Firm* — Amerson Law Firm, PLLC (57) ABSTRACT

Generally, the present disclosure is directed to a method of at least reducing unwanted erosion of isolation structures of a semiconductor device during fabrication. One illustrative method disclosed includes forming an isolation structure in a semiconducting substrate and forming a conductive protection ring above plurality isolation structure.

24 Claims, 10 Drawing Sheets

METHOD OF PROTECTING STI STRUCTURES FROM EROSION DURING PROCESSING OPERATIONS

BACKGROUND OF THE INVENTION

1. Field of the Invention

The present disclosure generally relates to the field of fabricating integrated circuits, and, more particularly, to a method of protecting shallow trench isolation (STI) structures from erosion or etching attacks during processing operations.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance, while, however, increasing dynamic power consumption of the individual transistors. That is, due to the reduced switching time interval, the transient currents upon switching a MOS transistor element from logic low to logic high are significantly increased.

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor. Furthermore, in sophisticated micro-controller devices and other sophisticated devices, an increasing amount of storage capacity may be provided on chip (so-called embedded memory) with the CPU core, thereby also significantly enhancing the overall performance of modern computer devices. For example, in typical micro-controller designs, different types of storage devices may be incorporated so as to provide an acceptable compromise between die area consumption and information storage density versus operating speed.

Many complex integrated circuit devices typically include a memory array, such as an embedded DRAM array, and other non-memory circuits, e.g., logic circuits (such as microprocessors), located outside of the memory array. One problem associated with manufacturing such complex devices is that some designers and manufacturing engineers tend to treat the regions outside the memory array and the memory array itself as completely separate items, each with their own unique design rules and process flows. As a result, in some cases, manufacturing such complex devices is not as cost-effective or efficient as it could be. For example, by independently focusing on one region to the exclusion of the other, additional manufacturing operations may be performed only in that one region, which tends to require additional manufacturing time, makes the resulting device more costly, and may lead to decreased product yields.

The fabrication of advanced integrated circuit devices, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NFETs) and/or P-channel transistors (PFETs), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. These transistors are typically separated by an isolation region, such as a shallow trench isolation (STI) region, that may be fabricated using known techniques.

Numerous processing operations are performed in a very detailed sequence, or process flow, to form such integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. As a result, the STI structures may not perform their isolation function as intended which may result in problems such as increased leakage currents, etc. Furthermore, since the erosions of the STI structures is not uniform across a die or a wafer, such structures may have differing heights which can lead to problems in subsequent processing operations. For example, such height differences may lead to uneven surfaces on subsequently deposited layers of material which may require additional polishing time in an attempt to planarize the surface of such layer. Such additional polishing may lead to the formation of additional particle defects which may reduce device yields.

Figure 1A:
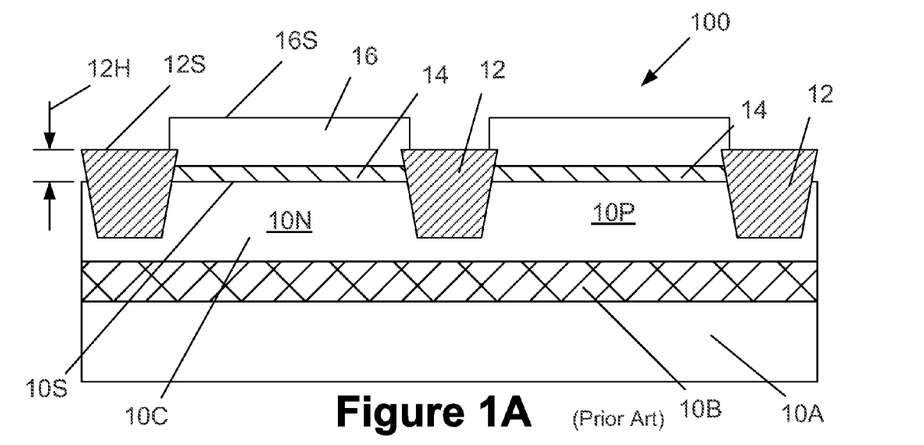
FIG. 1A-1H are various views of an illustrative semiconductor device schematically depicting erosion of STI structures 12 when it is subjected to illustrative prior art manufacturing techniques.

Illustrative examples wherein STI structures may be subjected to the non-uniform erosion issues discussed above are depicted in FIGS. 1A-1H. FIG. 1A depicts an illustrative prior art device 100 at an early stage of manufacture. The prior art device 100, when completed, will include a plurality of NFET transistors and a plurality of PFET transistors formed in and above a semiconducting substrate 10. The illustrative transistors are not depicted in FIG. 1A. However, a NFET transistor will be formed in and above an illustrative N-active region 10N, and a PFET transistor will be formed in and above an illustrative P-active region 10P depicted in FIG. 1A. The N-active regions 10N and the P-active regions 10P across a die are typically separated by illustrative isolation structures 12, e.g., shallow trench isolation structures, formed in the substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration.

Typically, during the formation of the PFET transistor, a layer of semiconductor material 24 (see FIG. 1H), e.g., silicon germanium, is selectively formed on the active layer 10C in the P-active region 10P where the PFET transistor will be formed to enhance the performance of the PFET transistor. Typically, such a semiconductor layer 24 is not formed in the N-active region 10N where the NFET transistor will be formed. In general, given the differences in the structure of the NFET transistors and the PFET transistors, and different techniques that are used in an attempt to enhance the performance of the NFET transistors and the PFET transistors, the active regions 10N, 10P, and the adjacent isolation structures 12 are subject to different processing operations. For example, prior to selectively forming the layer of semiconductor material 24 for the PFET transistors in only the P-active regions 10P, one or more etching and masking process may be performed only on such P-active regions 10P. The differing process operations to which the STI structures 12 are subjected may cause varying erosion of the STI structures 12.

In FIG. 1A, the device 100 is depicted at the point of fabrication where an illustrative screen or pad oxide 14 and a pad nitride layer 16 have been formed above the active regions 10N, 10P. In one illustrative example, The pad oxide layer 14 may have a thickness of the order of 2-9 nm, while the pad nitride layer 16 may have a thickness on the order of 10-80 nm. To arrive at the structure depicted in FIG. 1A, the pad oxide layer 14 and the pad nitride layer 16 were deposited above the substrate and patterned using traditional photolithography and etching processes. Thereafter, trenches for the STI structures 12 are formed in the active layer 10 using the patterned pad oxide layer 14 and pad nitride layer 16 as an etch mask. Thereafter, a deposition process is performed with, for example, silicon dioxide, to overfill the trenches formed in the active layer 10A. A CMP process is then performed to remove excess STI material, like silicon dioxide, from above the surface 16S of the pad nitride layer 16. Then, a subsequent deglazing (etching) process may be performed in which the upper surface 12S of the STI structures 12 is lowered or pulled back to a level that is below that of the surface 16S of the pad nitride layer 16. Typically, the upper surface 12S of the STI structures 12 will be set to be some desired height 12H above the surface 10S of the active layer 10C. The height 12H will vary depending upon the application, but in one illustrative example, the height 12H may be on the order of 20-30 nm to accommodate loss of the STI material in subsequent processing operations.

Figure 1B:
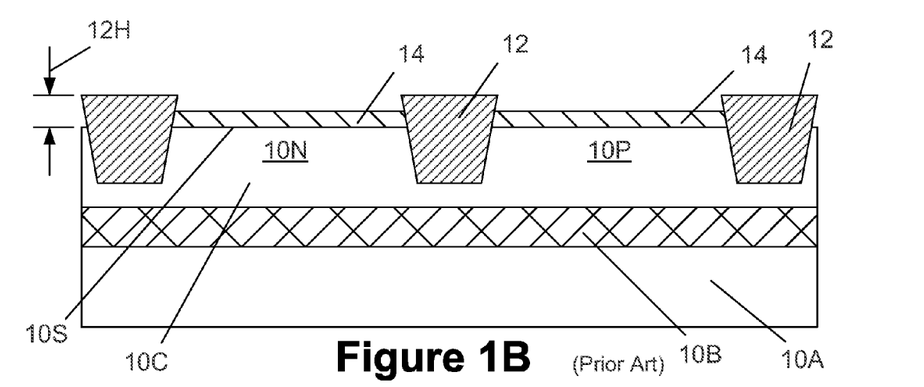

FIG. 1B depicts the device after the pad nitride layer 16 has been removed by performing an etching process. During the etching process, the STI structures 12 are subject to some erosion (depending upon the selectivity of the etching process), but it tends to be uniform in nature as all of the STI structures 12 are subjected to this etching process.

Figure 1C:
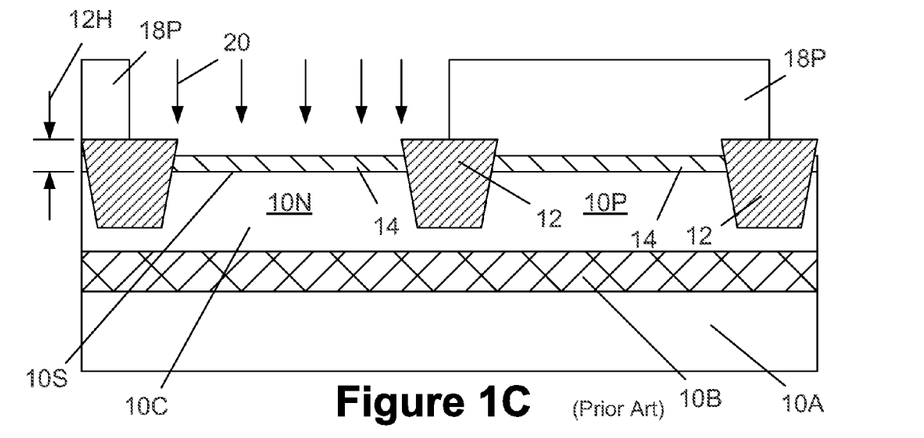
Figure 1D:
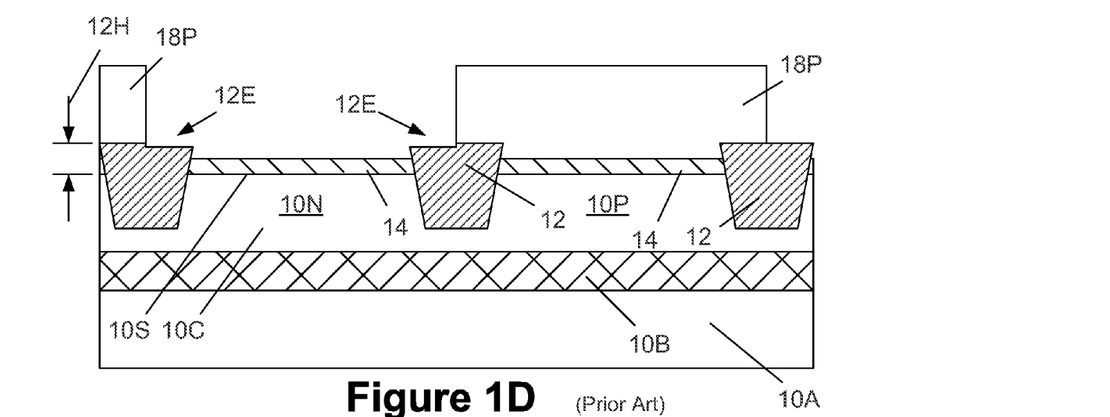

Next, as shown in FIG. 1C, a masking layer 18P is formed over the P-active regions 10P which exposes the N-active regions 10N for further processing. The masking layer 18P may be comprised of, for example, photoresist. In FIG. 1C, one or more illustrative ion implant processes 20 may be performed on the N-active regions 10N, e.g., threshold voltage implants, well implants, etc. Thereafter, a cleaning or striping process (an etching process) is performed on the N-active regions 10N. Again, depending upon the selectivity of such a cleaning process relative to the materials of the STI structures 12, the STI structures 12 may be subjected to some erosion 12E in the N-active regions 10N only, as schematically depicted in FIG. 1D. Although not depicted in the drawings, similar masking and implantation processes would be performed in the P-active regions 10P with the corresponding erosion of the STI structures 12 in those P-active regions 12P.

Figure 1E:
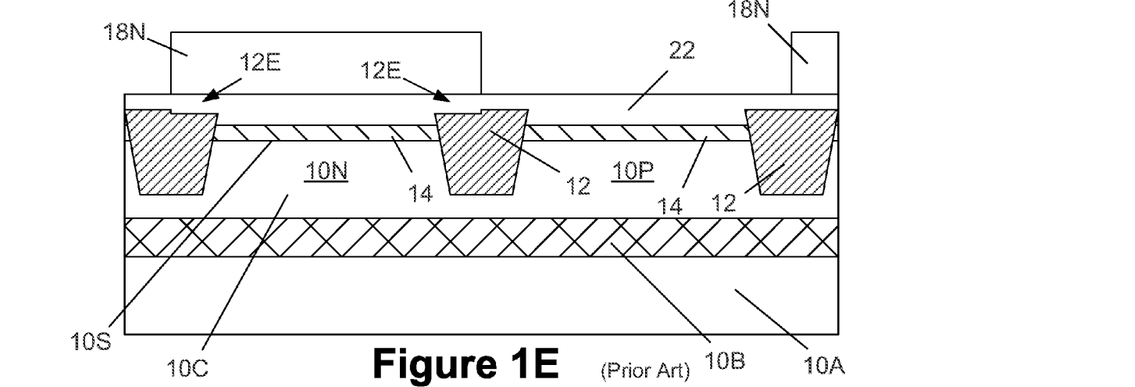

Next, as shown in FIG. 1E, a hard mask layer 22 is typically blanket-deposited above the pad oxide layer 14. This hard mask layer 22 may be comprised of a variety of materials such as silicon nitride or silicon dioxide. Thereafter, a masking layer 18N is formed over the N-active regions 10N which exposes the P-active regions 10P for further processing. The masking layer 18N may be comprised of, for example, photoresist.

Figure 1F:
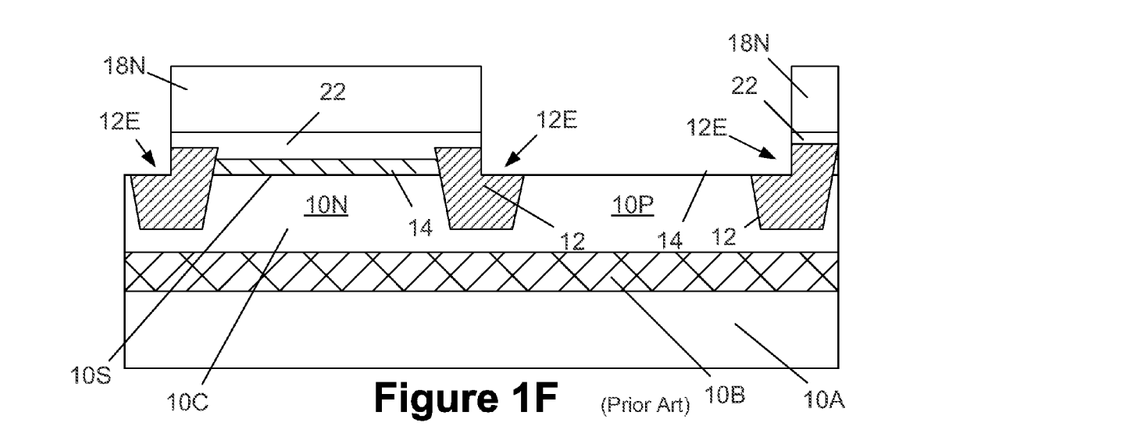

Next, as shown in FIG. 1F, one or more etching processes are performed to expose the surface 10S of the exposed P-active region 10P. Depending upon the etch selectivity of these etching processes relative to the materials of the STI structures 12, the STI structures 12 may be subjected to some additional erosion 12E in the P-active regions 10P only, as schematically depicted in FIG. 1F.

Figure 1G:
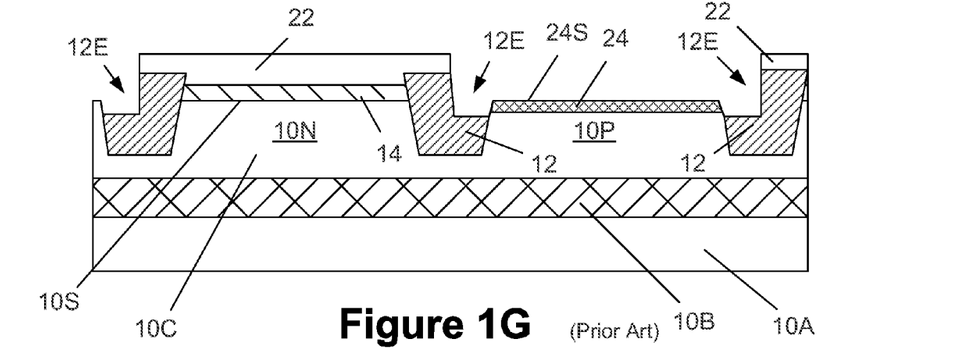

In FIG. 1G, the device is depicted at the point where the masking layer 18N has been removed and the layer of semiconductor material 24, e.g., silicon germanium, has been selectively formed on only the exposed P-active regions 10P where PFET transistors will be formed. This layer of semiconductor material 24 is formed to enhance the performance of the PFET transistor that will be formed in and above the P-active layer 10P. The layer of semiconductor material 24 is typically formed using an epitaxial growth/deposition process and it may have a thickness of approximately 20-25 nm. Prior to forming the layer of semiconductor material 24, one or more etching/cleaning processes are typically performed on the exposed P-active regions 10P only. For example, in some cases, an etching process may be performed to recess the P-active region 10P prior to the formation of the semiconductor layer 24. Ideally, after all processing is completed, the upper surface 24S of the semiconductor layer 24 will be approximately even with the upper surface 10S of the active layer 10A in the N-active regions 10N. Additionally, after the formation of the layer of semiconductor material 24, an etching process may be performed to reduce the thickness of the layer of semiconductor material 24. Again, depending upon the etch selectivity of these etching processes relative to the materials of the STI structures 12, the STI structures 12 may be subjected to some additional erosion 12E in the P-active regions 10P only, as schematically depicted in FIG. 1G.

Figure 1H:
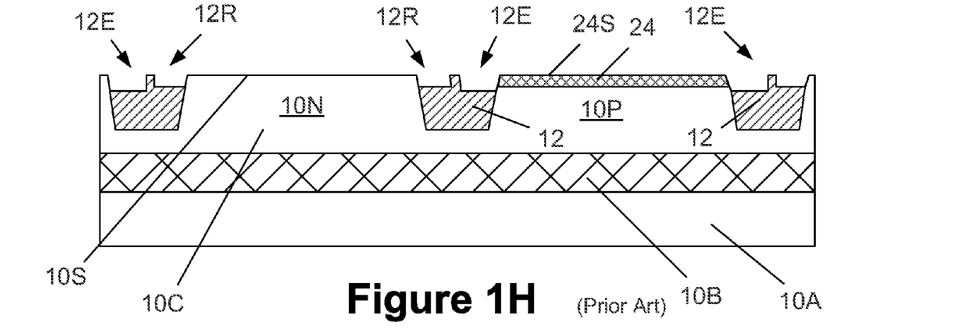

FIG. 1H depicts the device after the hard mask layer 22 and the pad oxide layer 14 have been removed. As a result of the different process operations performed in the N-active region 10N and the P-active region 10P, as described above, the STI structures 12 have schematically depicted uneven recesses or divots 12R, which may cause some of the problems identified above. The formation of such recesses or divots 12R in the STI structures 12 is not limited to those that may be present in the illustrative examples discussed in connection with the discussion of FIG. 1A-1H. Due to differing process operations performed in, for example, a logic area of an integrated circuit device and an embedded memory array of the device may result in similar erosion of the STI structures 12, with corresponding detrimental effects. From an overall perspective, such uneven erosion of the STI structures 12 may also lead to reduced yields and/or decreased performance capabilities of the resulting semiconductor device.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a method of protecting isolation structures, such as illustrative STI structures, from erosion during semiconductor manufacturing operations. One illustrative method disclosed herein includes forming an isolation structure that extends at least partially into a semiconducting substrate and forming a conductive protection ring above the isolation structure. In some illustrative embodiments, the conductive protection ring is substantially self-aligned with the underlying isolation structure. In other illustrative embodiments, the conductive protection ring may actually contact the underlying isolation structure.

Another illustrative method includes forming a shallow trench isolation structures that extends at least partially into a semiconducting substrate, wherein the trench isolation structure, when initially formed, has an upper portion with an initial thickness (as defined between an upper surface of the trench isolation structure and a surface of said substrate) and performing at least one etching process to reduce the initial thickness of the upper portion of the isolation structure. The method further includes, after performing the etching process to reduce the thickness of the isolation structure, forming a conductive protection ring on the trench isolation structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Moreover, the relative size of such features and structures may be exaggerated so as to facilitate explanation of the subject matter disclosed herein. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally related limiting or reducing undesirable erosion of isolation structures, such as illustrative trench isolation structures, during semiconductor manufacturing operations. The present invention is disclosed in the context of an illustrative integrated circuit device that includes at least one memory array, such as an embedded DRAM (eDRAM) array, and additional circuits outside of the memory array, such as logic circuits, peripheral circuits, etc. (hereinafter generically referred to as "logic circuits" or "logic devices" or "logic regions"). In disclosing the subject matter herein, reference will be made to FIGS. 2A-2N and perhaps to FIGS. 1A-1H. To the extent that both sets of figures include the same reference number, it should be understood that such reference refers to the same or similar materials and/or structures.

Figure 2A:
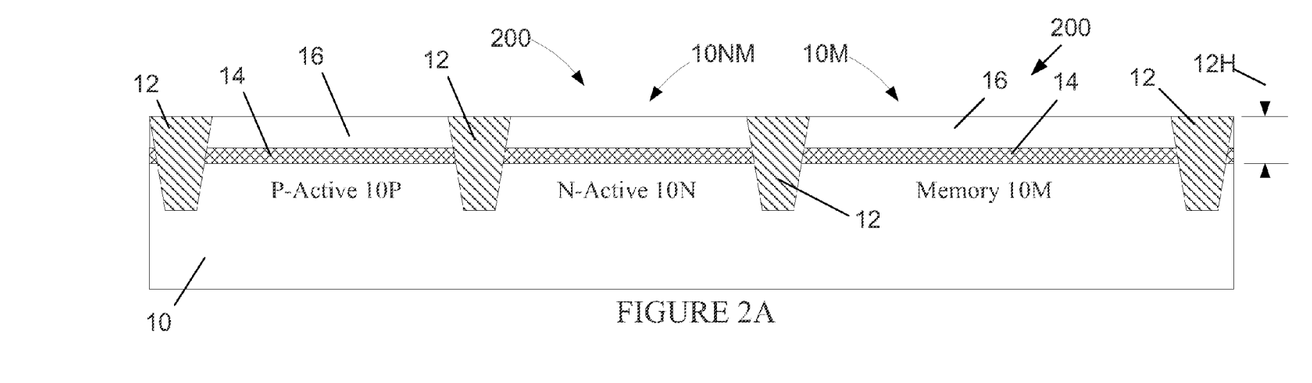
FIG. 2A-2N depict illustrative methods that may be employed as described herein to at least reduce some erosion of isolation structures during semiconductor manufacturing operations.

As shown in FIG. 2A, an integrated circuit device 200 is depicted at an early stage of fabrication. The integrated circuit device 200 is formed in and above a semiconducting substrate 10. The substrate 10 may be made of any semiconducting material, e.g., silicon, and the substrate may have a silicon-on-insulator (SOI) configuration, or it may have a bulk configuration. In one illustrative embodiment, the memory array 10M depicted herein is an embedded DRAM device, although the methods disclosed herein may be employed with other forms of memory devices. The integrated circuit device 200 includes an illustrative memory array 10M and one or more non-memory regions 10NM located outside of the memory array 10M. The non-memory region 10NM is intended to be illustrative in nature and it may include any of a variety of different integrated circuit devices, such as a micro-processor, an ASIC, etc. and it may include one or more semiconductor devices, such as transistors, capacitors, resistors, etc.

The integrated circuit device 200 generally includes a plurality of isolations structures 12, such as illustrative trench isolation structures, formed in the substrate 10. The isolation structures 12 are intended to be illustrative in nature and they may be any of a variety of different isolation structures, including the illustrative shallow trench isolation (STI) structures 12 depicted in the drawings. Of course, after a complete reading of the present application, those skilled in the art will appreciate that the present disclosure is not limited to use with only the illustrative shallow trench isolation (STI) structures 12 depicted herein. Nevertheless, for ease of reference, the present subject matter will be disclosed by reference to the specific example of illustrative STI structures 12, although the present invention is not so limited. The formation of the illustrative STI structures 12 may be accomplished in a manner similar to that described previously with respect to FIG. 1A.

In general, the STI structures 12 separate the substrate 10 into three regions, the memory region 10M that includes a memory array, a P-active region 10P and an N-active region 10N. Ultimately, a PFET transistor will be formed in and above the illustrative P-active region 10P, a NFET transistor will be formed in and above an illustrative N-active region 10N, and a memory array will be formed in and above the memory regions 10M. As will be recognized by those skilled in the art the memory region 10M itself contains a plurality of N-active and P-active regions, although they are not depicted in the drawings. Those skilled in the art appreciate that, when viewed from the top, the STI structures 12 are a ring like structure that defines a portion of the substrate 10 (or the active layer of an SOI substrate) which is electrically isolated from other regions of the substrate 10 (or the active layer of an SOI substrate). Semiconductor devices, such as illustrative transistors may be formed in these electrically isolated regions of the substrate 10 (or the active layer of an SOI substrate). Of course, the shape and/or configuration of such STI structures 12 may vary depending upon the particular application. For example, the ring-like STI structures 12 may have a generally rectangular or generally square configuration when viewed from the top, although other configurations are also possible, such as substantially oval, substantially triangular, irregular, substantially hexagonal, etc. Additionally, in some cases, adjacent devices may share at least a portion of an STI structure formed for a neighboring device.

At the point of fabrication depicted in FIG. 2A, the illustrative screen or pad oxide layer 14 and the pad nitride layer 16 have been formed above the substrate 10. In one illustrative example, the pad oxide layer 14 may have a thickness on the order of approximately 8-10 nm. In one illustrative embodiment, the pad nitride layer 16 may have a thickness of approximately 20-80 nm. The initial height 12H of the illustrative STI structures 12 above the surface 10S of the substrate 10 will be the combined thickness of the pad oxide layer 14 and the pad nitride layer 16. Thus, in the illustrative examples provided above, the height 12H may range from approximately 28-90 nm. That is, an upper portion of the STI structures 12 extends above the surface 10S of the substrate 10.

Figure 2B:
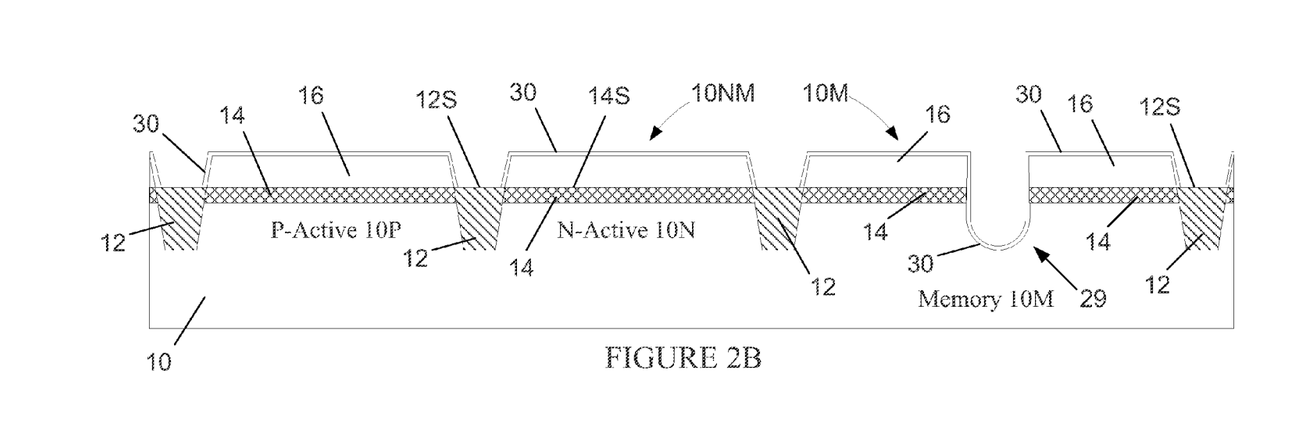

Next, as shown in FIG. 2B, one or more etching process are performed to define a trench 29 in the substrate 10 using one or more masking layers (not shown) to mask the P-active region 10P and the N-active region 10N. Ultimately, in one illustrative embodiment disclosed herein, a transistor that is part of a buried word line for the memory array will be formed in the trench 29. After the trench 29 is formed, an etching process is performed to reduce the thickness or initial height 12H of the upper portions of the STI structures 12 such that, in one illustrative embodiment, the surface 12S of the STI structures 12 is approximately even with the surface 14S of the pad oxide layer 14. The etching process that is performed to reduce the thickness or height of the upper portion of the STI structures 12 may be either a wet or dry etching process that is selective relative to the pad nitride layer 16. As will be recognized by those skilled in the art after a complete reading of the present application, the techniques described herein may be used to eliminate or at least reduce the extra step height, e.g., 20-30 nm, that is normally provided on such STI structures 12 to accommodate for future erosion losses in subsequent processing operations.

After the thickness or height of upper portion of the STI structures 12 is reduced as depicted in FIG. 2B, a gate insulation layer 30 may be formed in the trench 29 and on the exposed surfaces of the pad nitride layer 16. In one illustrative embodiment, the gate insulation layer 30 may be comprised of silicon dioxide, it may have a thickness ranging from approximately 2-8 nm, and it may be formed by a thermal growth process. It should be noted that, using the methods disclosed herein, it is possible to form gate insulation layers in the memory region 10M that have different properties than the gate insulation layers formed for transistor devices in the non-memory regions 10NM. For example, for high speed transistors in the non-memory region, the gate insulation layer of such transistors may have a thickness of, for example, 1-4 nm, in an effort to achieve the highest possible switching speed. In contrast, if desired, using the methods disclosed herein, the gate insulation layer 30 for the buried word lines in the memory region 10M may be much thicker if desired for that particular application.

Figure 2C:
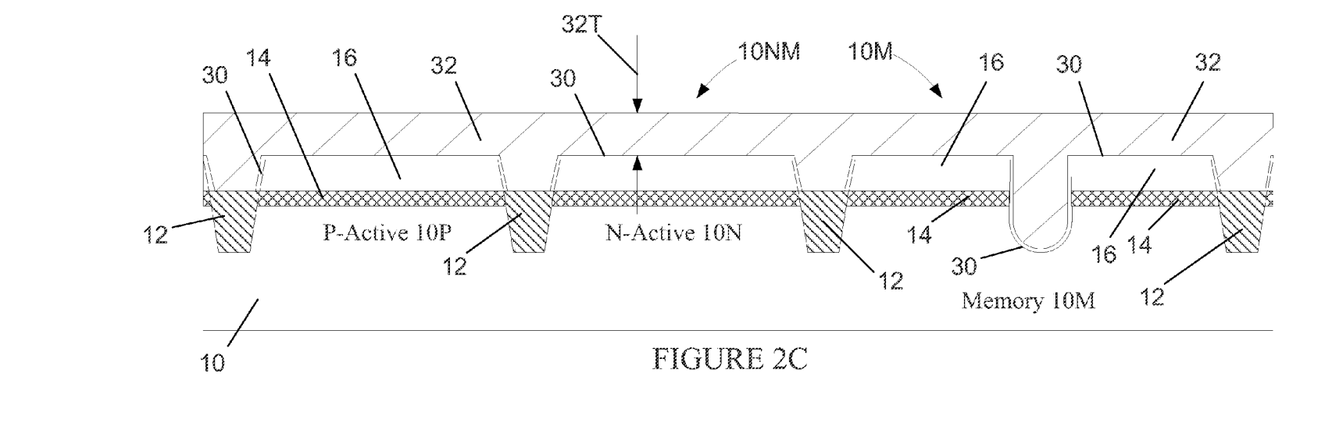

Next, as shown in FIG. 2C, a layer of conductive material 32 is formed above the substrate 10. In one illustrative example, the layer of conductive material 32 may be comprised of polysilicon, an amorphous silicon, titanium, titanium nitride, tungsten, or combinations thereof, etc. The layer of conductive material 32 may be formed by a deposition process, such as a chemical vapor deposition process or a conformal deposition process. Depending upon the material selected for the conductive material, and the manufacturing technique used to form such a material, the exact process flow involved may vary. In the illustrative example depicted in the drawings, the conductive material 32 may be deposited so as to substantially fill the region or recess above the STI structures 12. In other cases, a conformal deposition process, similar to a deposition process used to form barrier layers in metallization levels, may be performed to essentially form a relatively thin layer of conductive material on at least the upper surface of the STI structures 12. Thereafter, the remaining portions of the recess above the STI structures 12 may be filled with any desirable material. The thickness 32T of the layer of conductive material 32 may vary depending upon the particular application.

Figure 2D:
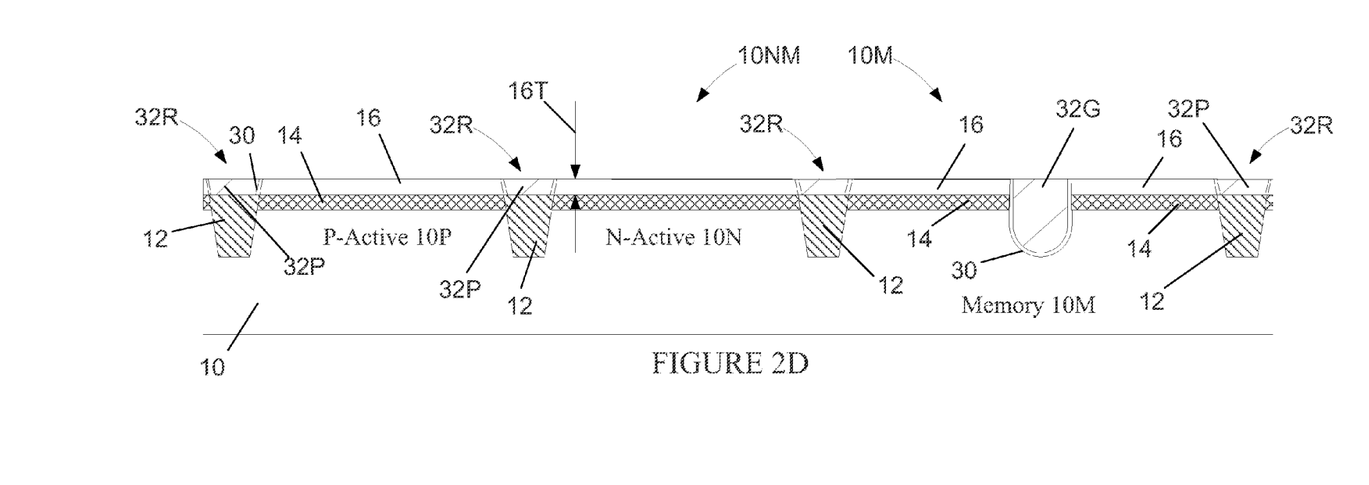

Then, as shown in FIG. 2D, in one illustrative example, excess amounts of the layer of conductive material 32 may be removed. In one illustrative example, the excess material may be removed by performing an chemical mechanical polishing (CMP) process. This CMP process may be performed for such a duration that the after polish thickness 16T of the pad nitride layer 16 may be at least about 10 nm. This process results in the definition of substantially self-aligned protective conductive layers 32P positioned above the STI structures 12 and a gate electrode structure 32G for the word line in the memory region 10M, as depicted in FIG. 2D. More specifically, and with additional reference to FIG. 2N, at this point in this illustrative process flow, an illustrative conductive protective ring structure 32R is formed (the cross-hatching of the conductive protective ring structure 32R in FIG. 2N is not to indicate a particular cross section, but rather such cross-hatching is provided for clarity and explanation purposes) and it is positioned above the STI structure 12 (not shown in FIG. 2N because it is positioned under the conductive protective ring structure 32R) in a substantially self-aligned manner relative to the STI structure 12 by virtue of the CMP removal process of excess conductive material described previously. Note that in some cases, depending upon the device under construction and/or the particular process flow used to form such a device, the conductive protective ring 32R may not actually contact the upper surface of the STI structure 12, i.e., there may be one or more layers of material positioned between the STI structure 12 and the conductive protection ring 32 R. FIG. 2N is a plan or top view of one illustrative embodiment of conductive protective ring structure 32R. As shown therein, the illustrative conductive protective ring structure 32R has an exterior perimeter 32EP and an interior perimeter 32IP. The overall configuration of conductive protective ring structure 32R will generally coincide with the overall configuration (when viewed from the top) of the underlying STI structure 12. After a complete reading of the present application, those skilled in the art will appreciate that the protective conductive layers 32P will be used to limit or at least reduce the erosion of the STI structures 12 as compared to the erosion experienced by such STI structures 12 using prior art processing techniques. The protective conductive layers 32P act to limit the extent to which the STI structures 12 are exposed to subsequent etching processes because they cover the top surface of the STI structures 12. The relatively minor erosion experienced by the STI structures 12 with the protective conductive layers 32P in place is not depicted in the drawings so as not to obscure the present inventions.

Figure 2E:
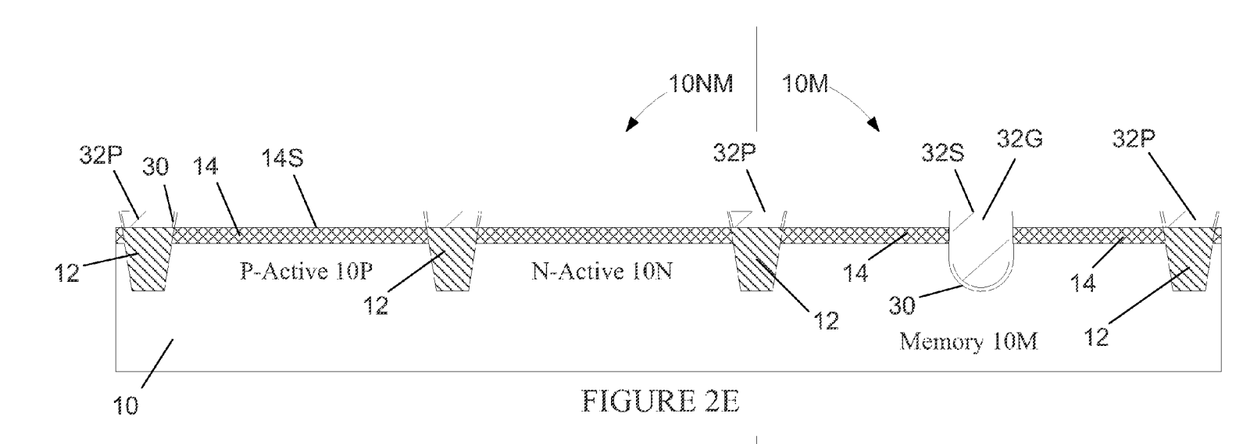

Next, as shown in FIG. 2E, an etching process may be performed to remove the pad nitride layer 16. In one illustrative embodiment, the etching process is a wet etching process, although a dry etching process may be used as well. During this etching process, the protective conductive layers 32P act to prevent or at least reduce the severity of the erosion of the STI structures 12.

Figure 2F:
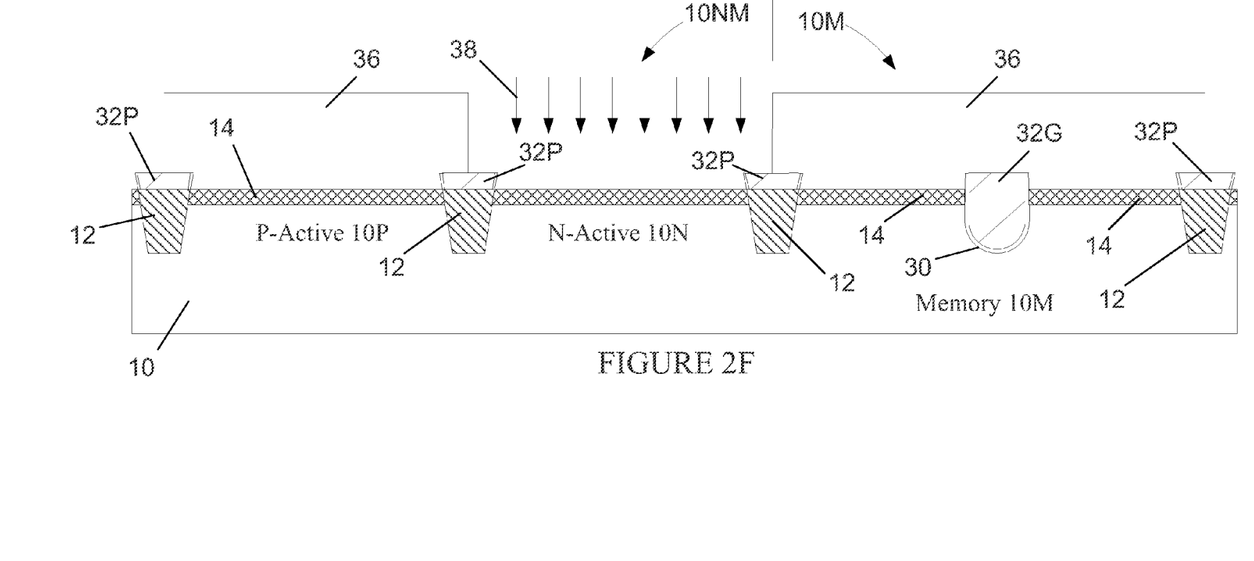

Then, as shown in FIG. 2F, an illustrative masking layer 36, e.g., photoresist, may be formed above the memory region 10M and the P-active region 10P, thereby leaving the N-active region 10N exposed for further processing. In the illustrative example depicted herein, one or more ion implant processes 38 may be performed to implant the desired dopants into the N-active region 10N, e.g., threshold voltage implants, well implants, etc. Of course, after a complete reading of the present application, those skilled in the art will appreciate that the various ion implantation process that are required in each of the memory region 10M, the N-active region 10N and the P-active region 10P may be performed in a manner and sequence that may vary depending of the device under construction and the desires of the device designer. Thus, the illustrative implant process 38 depicted as being performed on the N-active region 10N only, is simply an example and should not be considered a limitation of the present invention. After all the desired implantation processes are performed in the N-active region 10N, the masking layer 36 may be stripped, and one or more cleaning (etching) operations may be performed on the device. Again, unlike the prior art process flow described earlier, in the illustrative process flow described herein, the protective conductive layers 32P act to prevent or at least reduce the severity of the erosion of the STI structures 12 during such cleaning (etching) operations.

Figure 2G:
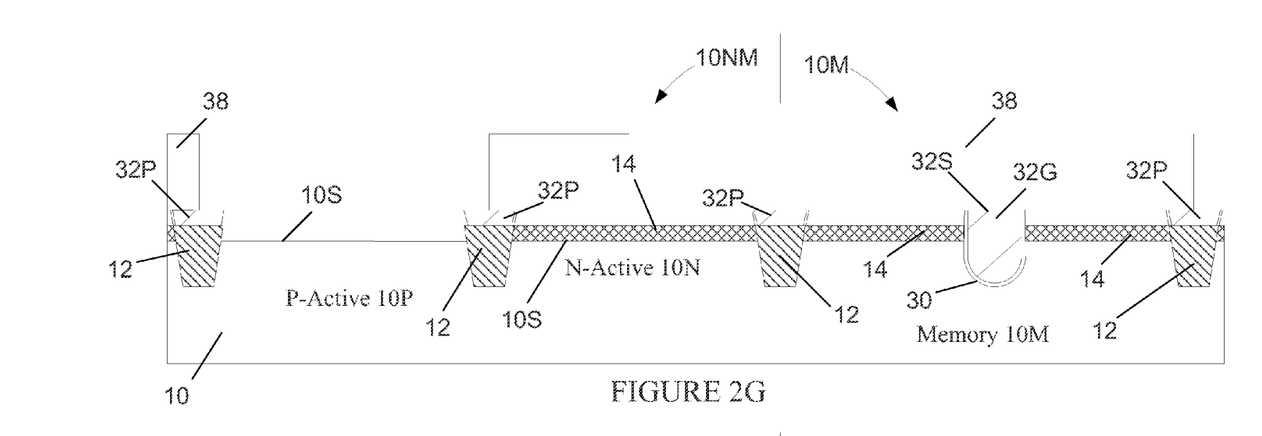

Next, as shown in FIG. 2G, in the illustrative process flow depicted herein, another masking layer 38 is formed above the memory region 10M and the N-active region 10N, thereby exposing the P-active region 10P to further processing operations. The P-active region 10P is selectively exposed so that the semiconductor layer 24, e.g., silicon germanium, may be formed for a future PFET transistor device that will be formed in and above the P-active region 10P. Initially, the structure depicted in FIG. 2G may be subjected to an etching process to remove the pad oxide layer 14 in the P-active region 10P. During the etching process, the protective conductive layers 32P act to prevent or at least reduce the severity of the erosion of the STI structures 12.

Figure 2H:
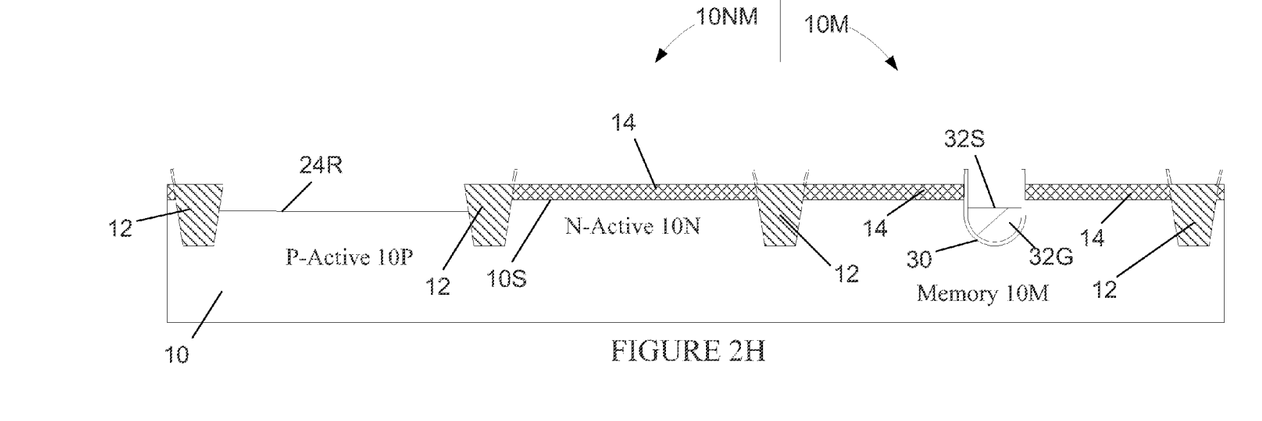

Then, as shown in FIG. 2H, the masking layer 38 is removed and one or more etching processes are performed on the device 200. The etching processes are selective to the pad oxide layer 14 and the material of the STI structures 12, and they accomplish three things: 1) the formation of a recess 24R in the P-active region 10P, 2) the removal of the protective conductive layers 32P form above the STI structures 12, and 3) lowering the surface 32S of the gate electrode 32G. In one illustrative embodiment, the depth of the recess 24R is selected such that, when the device is completed, the upper surface 24S of the semiconductor layer 24 is approximately even with the surface 10S of the active layer 10C in the N-active region 10N (see FIG. 2H). Again, during this etching process, the protective conductive layers 32P act to prevent or at least reduce the severity of the erosion of the STI structures 12. Note that at the end of the etching processes, the protective conductive layers 32P have been removed from above the STI structures 12, and thus the STI structures 12 may be subject to attack. However, using the novel process flow described herein, the time period for such an attack is limited as compared to prior art techniques.

Figure 2I:
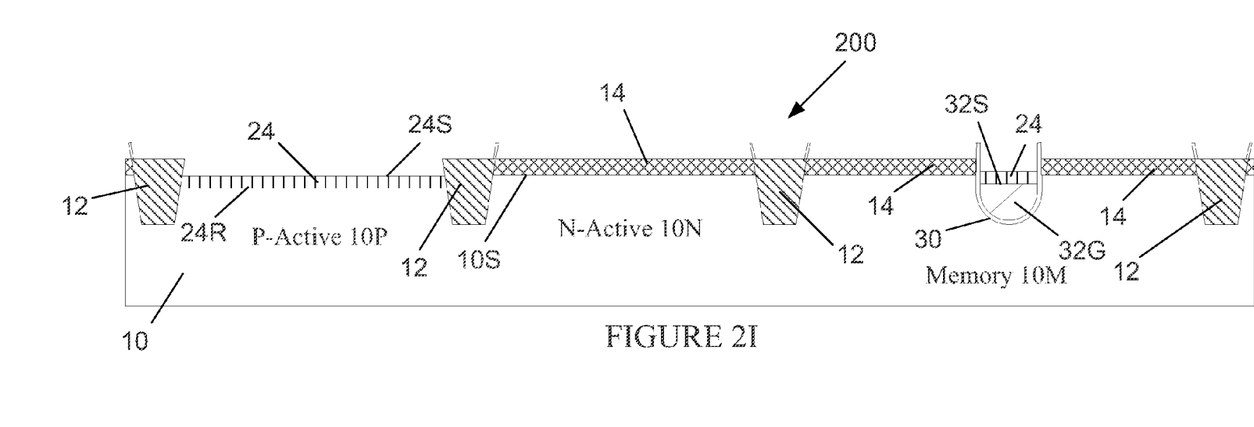

Then, as shown in FIG. 2I, in the illustrative example where the conductive material layer 32 is made from polysilicon or amorphous silicon, appropriate cleaning of the exposed silicon surfaces is performed, and the semiconductor layer 24, e.g., silicon germanium, is selectively formed on the P-active region 10P and the surface 32S of the gate electrode 32G. In the case where the gate 32G may be made from a conductive material other than polysilicon or amorphous silicon, such as a metal, then the semiconductor material 24 would only be formed on the P-active region 10P.

Figure 2J:
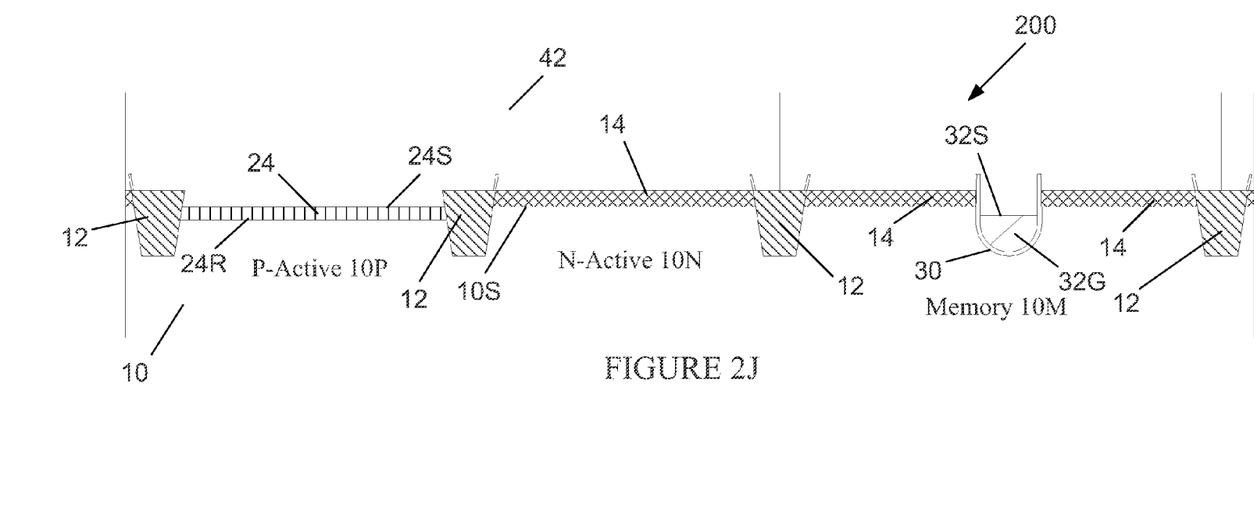

Next, as shown in FIG. 2J, another masking layer 42, e.g., photoresist, may be formed to expose the memory region 10M while covering the N-active region 10N and the P-active region 10P. At this time, if desired, an etching process may be performed to remove the semiconductor material 24 from the gate electrode structure 32 (which will be present if the conductive material layer is made of polysilicon or amorphous silicon). Additionally, the amount of gate recess (which is the level below the surface 10S) can be adjusted by the parameters of the etch process which in turn defines the gate length of this 3D-transistor) and together with various implantation process may be performed in the memory region 10M at this time if desired.

Figure 2K:
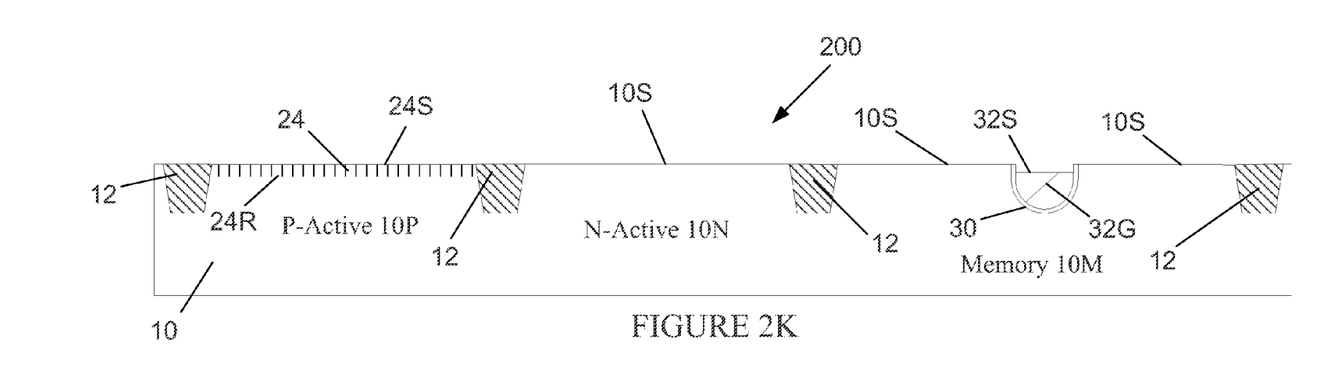

Then, as shown in FIG. 2K, the masking layer 42 is removed and one or more etching processes is performed to strip the pad oxide layer 14 from the substrate 10. While the STI structures 12 are subjected to this etching process without the protective conductive layers 32P in place, the erosion is more uniform as the entirety of the STI structures 12 is subjected to the erosion process. Such relatively uniform erosion can be accounted for in the design and manufacturing process, for example, in the selection of the initial height 12H of the STI structures 12 and/or the amount of over-polishing performed as discussed in connection with FIG. 2D above.

Figure 2L:
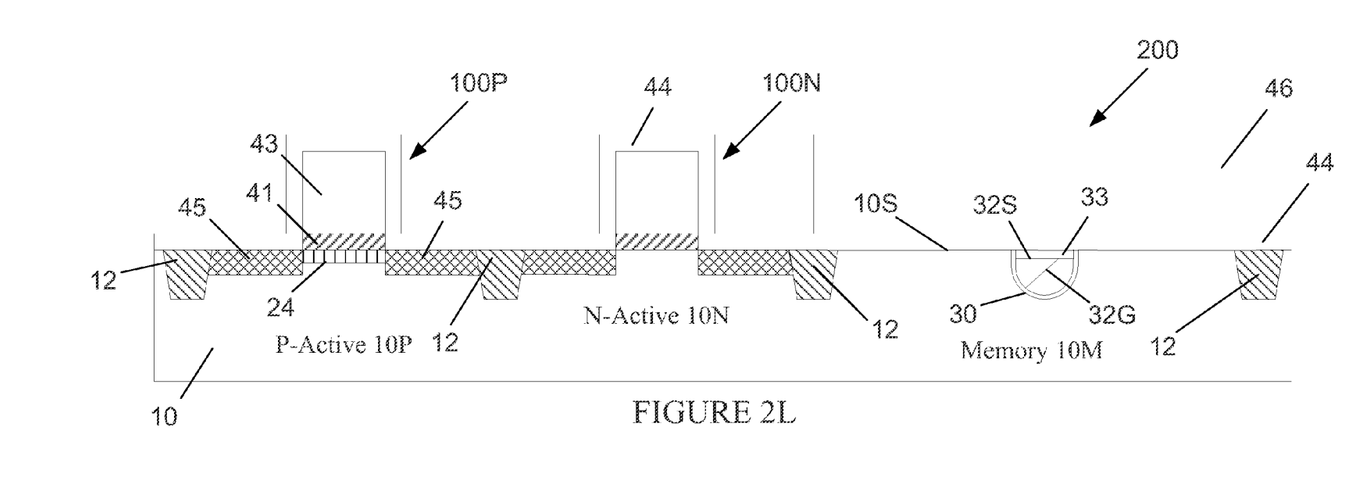
Figure 2M:
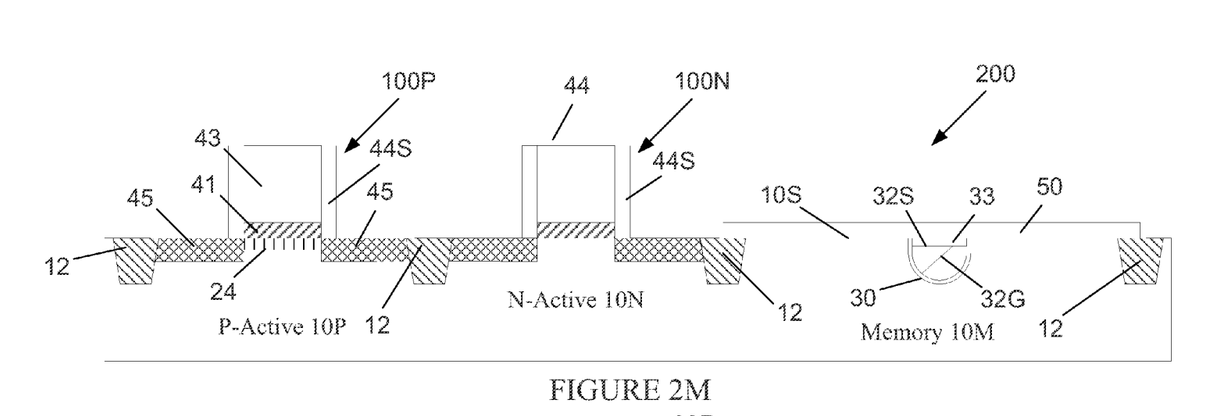
Figure 2N:
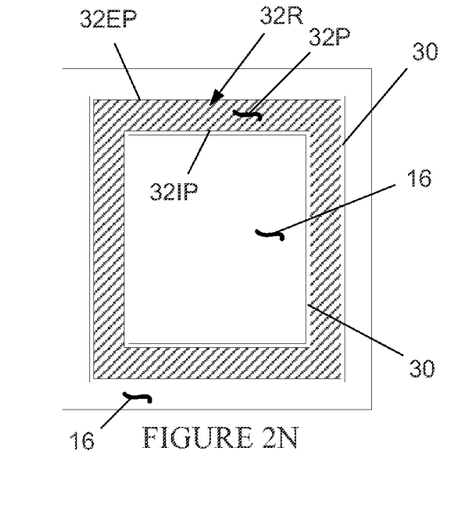

At this point, manufacturing of the integrated circuit device 200 may continue in accordance with normal processing procedures, such as gate insulation and gate electrode formation in the P-active region 10P and N-active region 10N, sidewall spacer formation, the formation of multiple metallization layers, etc. However, using the illustrative techniques disclosed herein a protection layer comprised of spacer material may be formed above the memory region 10M as part of the overall process flow. For example, FIG. 2L depicts the device 200 wherein a schematically depicted NFET transistor 100N and a PFET transistor 100P are formed above the N-active region 10N and P-active region 10P, respectively, using known processing techniques. In general, each of the illustrative transistors 100N, 100P includes a gate insulation layer 41, a gate electrode structure 43, and illustrative implant regions 45, such as extension implant regions. Of course, the details of construction of the illustrative transistors 100N, 100P may vary greatly depending upon the nature of the device 200 under construction. At the point depicted in FIG. 2L, a layer of spacer material 44, for example, silicon nitride, is conformally deposited on the device 200. Note that, an insulating material 33, such as silicon dioxide, may be formed above the surface 32S of the gate electrode 32 prior to forming the layer of spacer material 44 to electrically isolate the gate electrode 32G. Thereafter, a masking layer 46, e.g., photoresist, is formed above the memory region 10M. Then, an anisotropic etching process is performed to define the sidewall spacers 44S adjacent the gate electrode structures for the NFET transistor 100N and the PFET transistor 100P, as shown in FIG. 2L. This etching process, with the masking layer 46 in place, provides a protective hard mask 50 (see FIG. 2M), e.g., portions of the layer of spacer material 44, above the memory region 10M that may be used to protect that region from further processing operations in the N-active regions 10N and P-active regions 10P.

The particular embodiments disclosed above are illustrative only, as the invention may be modified and practiced in different but equivalent manners apparent to those skilled in the art having the benefit of the teachings herein. For example, the process steps set forth above may be performed in a different order. It should also be understood that reference to the surfaces as "upper surfaces" is only intended to convey the relative position of those surfaces relative to the surface of the substrate, and it is not intended to describe the absolute position of those surfaces relative to ground. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a shallow trench isolation structure that extends at least partially into a semiconducting substrate;
    forming a conductive protection ring above on and in contact with said shallow trench isolation structure;
    exposing said conductive protection ring to at least one etching process; and
    after exposing said conductive protection ring to said at least one etching process, removing said conductive protection ring from above said shallow trench isolation structure.

2. The method of claim 1, wherein said shallow trench isolation structure, when initially formed, has an upper portion having an initial thickness between an upper surface of said shallow trench isolation structure and a surface of said substrate, and wherein the method further comprises, prior to forming said conductive protection ring above said shallow trench isolation structure, performing an etching process to reduce said initial thickness of said upper portion of said shallow trench isolation structure.

3. The method of claim 2, further comprising, after performing said etching process to reduce said initial thickness of said upper portion of said shallow trench isolation structure, forming a layer of conductive material above at least said shallow trench isolation structure with said reduced thickness.

4. The method of claim 3, further comprising performing at least one planarization process to remove at least a portion of said layer of conductive material and thereby define said conductive protection ring.

5. The method of claim 3, wherein said layer of conductive material is comprised of at least one of polysilicon and an amorphous silicon.

6. The method of claim 4, wherein performing said at least one planarization process further defines at least a portion of a gate electrode structure comprised of said conductive material in a memory array of a semiconductor device.

7. The method of claim 3, wherein said layer of conductive material is comprised of a metal.

8. The method of claim 6, further comprising performing a common epitaxial deposition process to form a layer of semiconductor material on said gate electrode structure in said memory array and on a recessed P-active region of said substrate.

9. The method of claim 8 wherein said layer of semiconductor material is comprised of silicon germanium.

10. The method of claim 8 further comprising removing said layer of semiconductor material from above said gate electrode structure in said memory array.

11. The method of claim 1, wherein said conductive protection ring is substantially self-aligned with respect to said shallow trench isolation structure.

12. The method of claim 1, wherein said conductive protection ring has an exterior perimeter and an interior perimeter.

13. A method, comprising:
    forming a trench isolation structure that extends at least partially into a semiconducting substrate, said trench isolation structure, when initially formed, having an upper portion having an initial thickness between an upper surface of said trench isolation structure and a surface of said substrate;
    performing at least one etching process to reduce said initial thickness of said upper portion of said trench isolation structure;
    after performing said at least one etching process to reduce said thickness of said trench isolation structure, forming a conductive protection ring on said trench isolation structure, wherein at least a portion of said conductive protection ring has a continuous ring-like structure that completely surrounds one of an active region and a memory region defined in said semiconducting substrate by at least a portion of said trench isolation structure.

14. The method of claim 13, further comprising performing at least one additional etching process wherein at least said at least said portion of said conductive protection ring is exposed to said at least one additional etching process and thereafter removing said conductive protection ring from above said isolation structure.

15. The method of claim 13, wherein forming said conductive protection layer on said trench isolation structure comprises:
    forming a layer of conductive material above at least said isolation structure with said reduced thickness; and
    performing at least one planarization process to remove at least a portion of said layer of conductive material and thereby define said conductive protection ring.

16. The method of claim 15, wherein said layer of conductive material is comprised of at least one of polysilicon and an amorphous silicon.

17. The method of claim 16, wherein performing said at least one planarization process further defines at least a portion of a gate electrode structure comprised of said conductive material in a memory array of a semiconductor device.

18. The method of claim 17, further comprising performing a common epitaxial deposition process to form a layer of semiconductor material on said gate electrode structure in said memory array and on a recessed P-active region of said substrate.

19. The method of claim 13, wherein said conductive protection ring is substantially self-aligned with respect to said isolation structure.

20. The method of claim 13, wherein said portion of said trench isolation structure defining said at least one of an active region and a memory region has a second continuous ring-like structure and wherein said portion of said conductive protection ring having said continuous ring-like structure is formed above an entire upper surface of said portion of said trench isolation structure having said second continuous ring-like structure.

21. The method of claim 1, wherein at least a portion of said isolation structure has a first continuous ring-like structure that defines at least one of an active region and a memory region in said semiconducting substrate, wherein at least a portion of said conductive protection ring has a second continuous ring-like structure that completely surrounds said at least one of said active region and said memory region defined by said isolation structure, and wherein said portion of said conductive protection ring having said second continuous ring-like structure is formed above an entire upper surface of said portion of said isolation structure having said first continuous ring-like structure.

22. The method of claim 1, further comprising, after removing said conductive protection ring from above said isolation structure, forming a gate electrode structure of a semiconductor device above at least one of an active region and a memory region defined in said semiconducting substrate by said isolation structure.

23. A method, comprising:

forming an isolation structure that extends at least partially into a semiconducting substrate, wherein, when initially formed, said isolation structure has an upper portion having an initial thickness between an upper surface of said isolation structure and a surface of said substrate;

performing an etching process to reduce said initial thickness of said upper portion of said isolation structure;

forming a conductive protection ring above said isolation structure, wherein forming said conductive protection ring comprises:

after performing said etching process, forming a layer of conductive material above at least said isolation structure having said reduced thickness; and performing at least one planarization process to remove at least a portion of said layer of conductive material and thereby define said conductive protection ring, said at least one planarization process further defining at least a portion of a gate electrode structure comprised of said conductive material in a memory array of a semiconductor device; and performing a common epitaxial deposition process to form a layer of semiconductor material on said gate electrode structure in said memory array and on a recessed P-active region of said substrate.

24. A method, comprising:

forming a trench isolation structure that extends at least partially into a semiconducting substrate, said trench isolation structure, when initially formed, having an upper portion having an initial thickness between an upper surface of said trench isolation structure and a surface of said substrate;

performing at least one etching process to reduce said initial thickness of said upper portion of said trench isolation structure; and after performing said at least one etching process to reduce said thickness of said trench isolation structure, forming a conductive protection ring on said trench isolation structure, wherein forming said conductive protection ring comprises:

forming a layer of conductive material above at least said isolation structure with said reduced thickness, wherein said layer of conductive material is comprised of at least one of polysilicon and an amorphous silicon; and performing at least one planarization process to remove at least a portion of said layer of conductive material and thereby define said conductive protection ring, said at least one planarization process further defining at least a portion of a gate electrode structure comprised of said conductive material in a memory array of a semiconductor device;

performing at least one additional etching process, wherein at least a portion of said conductive protection ring is exposed to said at least one additional etching process; and performing a common epitaxial deposition process to form a layer of semiconductor material on said gate electrode structure in said memory array and on a recessed P-active region of said substrate.

* * * * *